United States Patent
Garcha

(10) Patent No.: US 9,455,653 B1
(45) Date of Patent: Sep. 27, 2016

(54) RELIABLE CURRENT SENSING FOR INVERTER-CONTROLLED ELECTRONIC MACHINE

(71) Applicant: FORD GLOBAL TECHNOLOGIES, LLC, Dearborn, MI (US)

(72) Inventor: Jaswant S. Garcha, Windsor (CA)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 14/639,153

(22) Filed: Mar. 5, 2015

(51) Int. Cl.
| | |
|---|---|
| H02K 29/08 | (2006.01) |
| H02P 6/00 | (2016.01) |
| H02K 11/00 | (2016.01) |
| B60L 11/18 | (2006.01) |

(52) U.S. Cl.
CPC ............ *H02P 6/002* (2013.01); *B60L 11/1803* (2013.01); *H02K 11/0057* (2013.01)

(58) Field of Classification Search
CPC ........... H02K 29/08; H02P 6/16; H02P 6/14; H02P 6/06
USPC ............................. 318/727, 800, 801, 400.38
See application file for complete search history.

(56) References Cited

U.S. PATENT DOCUMENTS

| | | | | |
|---|---|---|---|---|
| 5,982,136 A * | 11/1999 | Pelly | ..................... | H02H 1/0007 318/801 |
| 6,005,383 A * | 12/1999 | Savary | ................. | G01R 15/207 324/117 H |
| 6,019,086 A | 2/2000 | Schneider et al. | | |
| 6,429,639 B1 * | 8/2002 | Pelly | ..................... | G01R 15/202 324/117 H |
| 6,757,641 B1 | 6/2004 | Immer et al. | | |
| 7,148,675 B2 * | 12/2006 | Itoh | ...................... | G01R 15/202 324/117 H |
| 7,646,160 B2 | 1/2010 | Chen et al. | | |
| 2003/0227284 A1 * | 12/2003 | Marasch | .............. | G01R 15/247 324/117 H |
| 2005/0151513 A1 * | 7/2005 | Cook | .................... | H02J 7/1423 320/137 |
| 2011/0221429 A1 | 9/2011 | Tamura | | |
| 2013/0027021 A1 * | 1/2013 | Gokhale | ............ | G01R 19/0015 324/117 R |
| 2013/0265041 A1 | 10/2013 | Friedrich et al. | | |
| 2014/0176124 A1 * | 6/2014 | Okumura | ................. | G01R 3/00 324/156 |

OTHER PUBLICATIONS

Didier Angleviel, et al., Development of a Contactless Hall effect Torque Sensor for Electric Power Steering, SAE-2006-01-0939, 2005.
Shaun Milano, et al., Hall Effect Current Sensing in Hybrid Electric Vehicle (HEV) Applications, Allegro MicroSystems, LLC, 296065-AN, 2010-2013, pp. 1-4.

* cited by examiner

*Primary Examiner* — Rina Duda
(74) *Attorney, Agent, or Firm* — David B. Kelley; MacMillan, Sobanski & Todd, LLC

(57) ABSTRACT

Phase currents of an inverter-driven electric machine are measured by mounting phase conductors of each respective phase current into a central passage of a respective flux core. A plurality of current sensors are mounted into a gap of each respective flux core to generate a respective plurality of current signals for each phase current. The Hall-effect devices are connected to a plurality of multi-channel op amp devices for conditioning the current signals such that each set of Hall-effect devices is connected to a different one of the op amp devices and such that each op amp device receives one current signal corresponding to each phase current. Thus, a valid conditioned current signal corresponding to each phase conductor is generated by the op amp devices unless there are multiple simultaneous failures of the Hall-effect devices and the op amp devices.

8 Claims, 5 Drawing Sheets

RELIABLE CURRENT SENSING FOR INVERTER-CONTROLLED ELECTRONIC MACHINE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to current sensing for controlling inverter-driven electric machines, and, more specifically, to increased fault tolerance for current sensing in connection with electric vehicle drives.

Electric vehicles, such as hybrid electric vehicles (HEVs) and plug-in hybrid electric vehicles (PHEVs), use inverter-driven electric machines to provide traction torque and regenerative braking torque. A typical electric drive system includes a DC power source (such as a battery pack or a fuel cell) coupled by contactor switches to a variable voltage converter (VVC) to regulate a main bus voltage across a main linking capacitor. A first inverter is connected between the main bus and a traction motor to propel the vehicle. A second inverter may be connected between the main bus and a generator to regenerate energy during braking to recharge the battery through the VVC. As used herein, electric machine refers to either the motor or generator.

The inverters include transistor switches (such as insulated gate bipolar transistors, or IGBTs) connected in a bridge configuration. An electronic controller turns the switches on and off in order to invert a DC voltage from the bus to an AC voltage applied to the motor, or to invert an AC voltage from the generator to a DC voltage on the bus. In each case, the inverters are controlled in response to various sensed conditions including the rotational position of the electric machine and the instantaneous current flowing in each phase winding of the machine.

Pulse-width modulated (PWM) switching of the inverter is typically performed under control of a motor/generator control unit (MGCU) based on comparing a desired motor current with a measured current. For example, a measured current may be used by a torque calculator to calculate an instantaneous motor torque. A desired torque may be obtained from a driver input device, such as an accelerator pedal, and an engine control unit. A particular acceleration or deceleration indicated by the driver's action is used to determine how much torque should be delivered to the vehicle wheels. A difference between the calculated torque demand and the actual torque (calculated from the measured current) is used to update the duty cycle and/or operating frequency being used for switching the inverter.

Reliable current sensing is essential for proper functioning of the PWM control for the electric machines in an electric vehicle. The use of redundant current sensors can increase reliability, but use of multiple sensors for each phase has introduced calibration/consistency issues when using redundant sensors to take multiple measurements of one phase current. Furthermore, it would be desirable to obtain a greater increase in robustness beyond that achieved by known circuit topologies that have introduced redundant sensors.

SUMMARY OF THE INVENTION

In one aspect of the invention, an electric drive for an electric vehicle with a multi-phase electric machine includes an inverter bridge having inverter switches arranged in a plurality of phase legs. An inverter controller controllably switches the inverter switches. First and second phase conductors are coupled between respective inverter phase legs and respective phase windings of the electric machine. First and second flux cores each having a central passage and a gap, respectively, are arranged so that the first and second phase conductors pass through the central passages of the first and second flux cores. A first plurality of current sensors comprised of a predetermined number of first Hall-effect devices are disposed in the gap of the first flux core to generate respective first current signals. A second plurality of current sensors comprised of the predetermined number of second Hall-effect devices are disposed in the gap of the second flux core to generate respective second current signals. A plurality of multi-channel op amp devices are provided for conditioning the current signals and coupling them to an inverter controller. The number of multi-channel op amp devices equals the predetermined number. Each one of the first Hall-effect devices is connected to a different one of the op amp devices, and each one of the second Hall-effect devices is connected to a different one of the op amp devices. Consequently, a valid conditioned current signal corresponding to each phase conductor is received by the inverter controller unless there are multiple failures of the Hall-effect devices and the op amp devices.

DETAILED DESCRIPTION OF PREFERRED EMBODIMENTS

Figure 1:
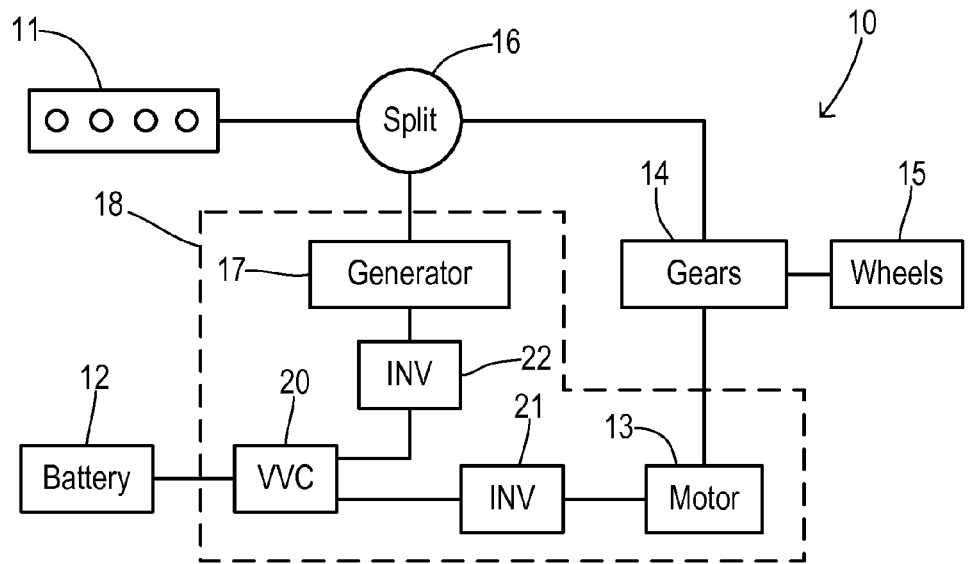
FIG. 1 is a block diagram showing one embodiment of a hybrid electric vehicle.

Referring now to FIG. 1, a vehicle 10 is shown as a hybrid electric vehicle with an electric drive system 18. Although a powersplit hybrid layout is shown, the present invention is also applicable to any type of electric vehicle (e.g., HEV, PHEV, or a fully electric vehicle). An internal combustion engine 11 and a battery pack 12 supply energy for propelling vehicle 10. Battery 12 drives a motor 13 with an output coupled to transmission gears 14 for driving vehicle wheels 15. A mechanical output of engine 11 is coupled to gears 14 via a splitting device 16 for providing an engine-driven mode of the powertrain. Splitting device 16 also couples gears 14 to a generator 17 so that during regenerative braking, available mechanical power from wheels 15 can be used to rotate generator 17, with recovered energy being used to charge battery 12 as known in the art. Thus, the electric machines (i.e., motor 13 and generator 17) are each coupled to wheels 15 for bidirectionally converting between stored electrical energy and rotation of the wheels.

Electric drive system 18 includes a variable voltage converter 20 for converting the battery voltage to a desired bus voltage which is controllably switched (i.e., commutated) by an inverter 21 to drive motor 13. An inverter 22 is coupled between generator 17 and converter 20 so that AC power from generator 17 during regenerative braking is inverted to DC power, which is further converted by converter 20 to an appropriate voltage for recharging battery 12.

Figure 2:
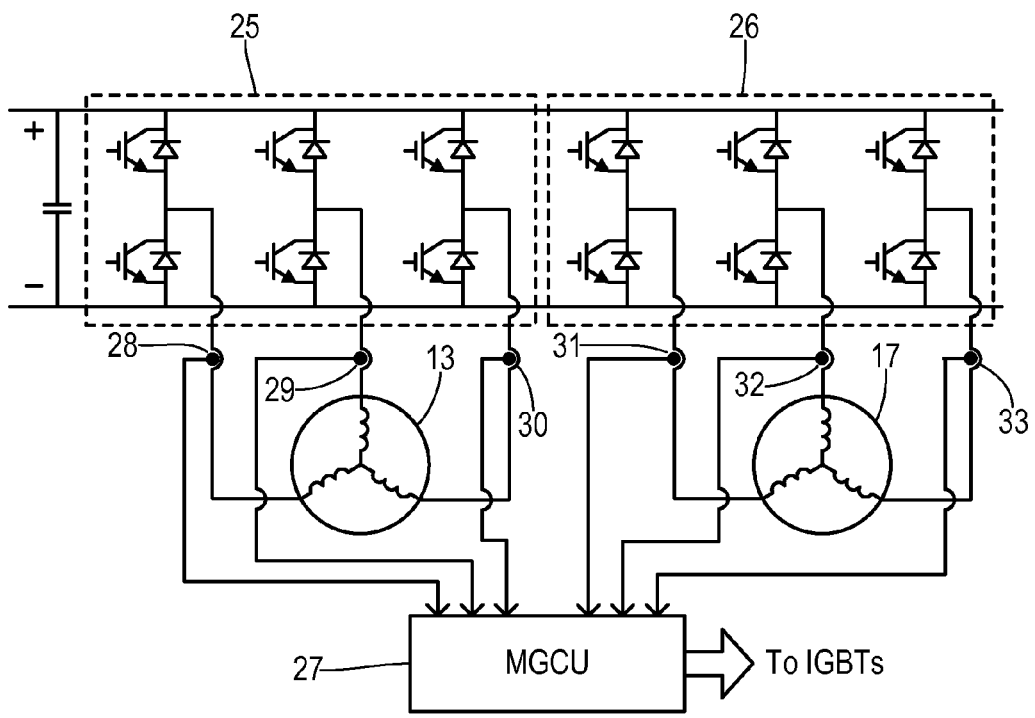
FIG. 2 is a schematic diagram showing inverter bridges and electric machine phase windings in greater detail.

In order to control IGBT transistor switches in inverter bridges 25 and 26, a prior art electric drive system includes a motor-generator control unit (MGCU) 27 as shown in FIG. 2. Current sensors 28-33 are arranged at each phase conductor between a respective inverter phase leg and a respective phase winding in order to sense a respective AC current and to provide a corresponding current signal to MGCU 27. One preferred type of device for measuring the phase currents is based on the Hall-effect which responds to the magnetic flux generated around the current-carrying wire in order to quantify the magnitude of the current while maintaining galvanic isolation from the load circuits. Hall-effect current sensors are available in integrated circuit packages incorporating various associated circuitry. To avoid saturation issues at current levels close to zero, a typical Hall-effect integrated circuit device generates an output voltage with a predetermined offset (i.e., the output voltage corresponding to a measured current of zero amps is at a predetermined voltage that is greater than zero, such as at $0.1 \times V_{cc}$). Thus, further signal conditioning is typically required to remove the offset and/or to otherwise amplify or shift the sensor signal.

Figure 3:
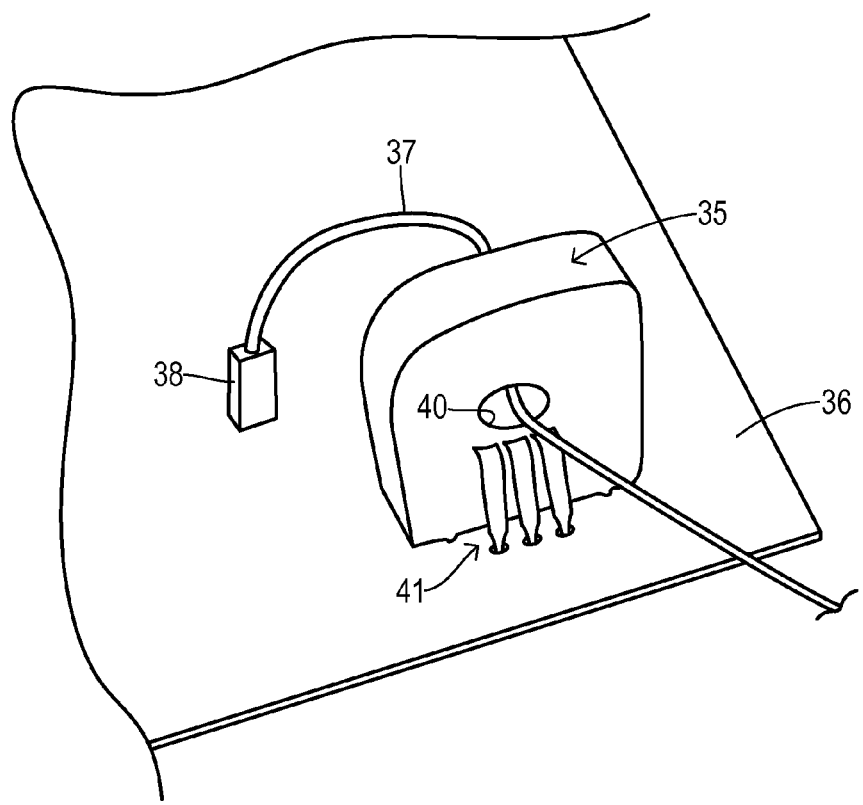
FIG. 3 is a perspective view showing a prior art Hall-effect current sensor mounted to a printed circuit board.

FIG. 3 shows an example of a prior art Hall-effect sensor unit in an integrated circuit package 35 mounted on a printed circuit board 36. A phase conductor 37 carries a load current to/from a respective motor phase from a terminal 38. Integrated circuit package 35 has a central passage 40 which receives conductor 37. Flux generated by a current flowing in conductor 37 is coupled to an internal magnetic core (not shown) and an embedded Hall-effect element which generates an output signal on one of output pins 41 proportional to the current magnitude. Multiple integrated circuit packages identical to package 35 could be mounted on circuit board 36 (each receiving conductor 37) in order to provide redundant measured signals. However, board space and cost may become excessive when using redundant packaging when each package incorporates a respective core with the Hall-effect elements.

Figure 4:
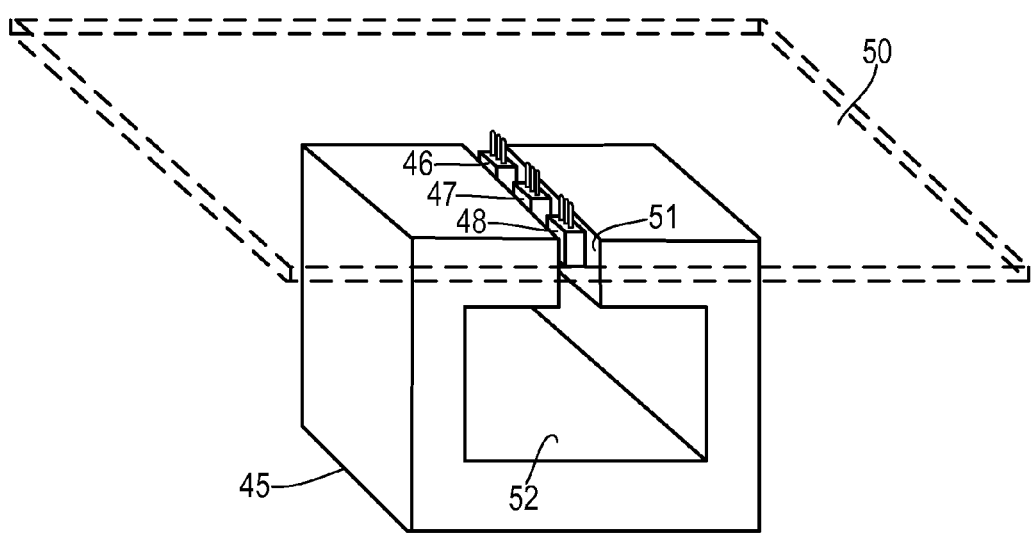
FIG. 4 is a perspective view showing redundant Hall-effect sensors mounted in a gap of a flux core, with a printed circuit board shown in phantom.

As shown in FIG. 4, the present invention achieves packaging efficiency by utilizing a shared flux core 45 with a plurality of Hall-effect elements 46-48. A printed circuit board (PCB) 50 is shown in phantom, with Hall-effect elements 46-48 mounted on a bottom side of circuit board 50, and with flux core 45 disposed at the bottom side so that a gap 51 in core 45 receives elements 46-48, and so that a central passage 52 receives the respective phase conductor (either in the form of a bus bar or an insulated conductor wire). The shape and magnetic properties of core 45 and the placement of Hall devices 46-48 within gap 51 are chosen to ensure that each device receives a substantially equal magnetic flux as a result of current flowing through a load conductor placed within central passage 52. Hall devices 46 may be through-hole mounted or surface mounted devices, for example. The A1363 Hall Effect Sensor IC and the A1381 Hall Effect Sensor IC, both available from Allegro MicroSystems, LLC, of Worcester, Mass., have been used to practice the invention.

For low current applications, core 45 may be sufficiently small to be mounted directly onto PCB 50. For higher current applications where a larger core is required, core 45 may preferably be mounted (e.g., potted) to a plastic case or housing (not shown) with gap 51 being placed such that when PCB 50 is mounted to the housing then devices 46-48 are properly oriented within gap 51. Likewise, a load conductor or bus bar (not shown) mounted on PCB 50 carrying the current to be measured may also extend from PCB 50 in order to be placed within central passage 52 when PCB 50 is fitted within the housing. Although FIG. 4 shows measurement of a single current, the invention may be applied to multi-phase electric drives with further duplication of the components. Thus, a typical three-phase drive may include an assembly wherein three flux cores are potted to a mechanical housing, and then a PCB carrying three sets of redundant Hall sensors is screwed onto the housing so that respective load-current conductors and the respective sets of Hall sensors are simultaneously placed into the respective flux cores.

Figure 5:
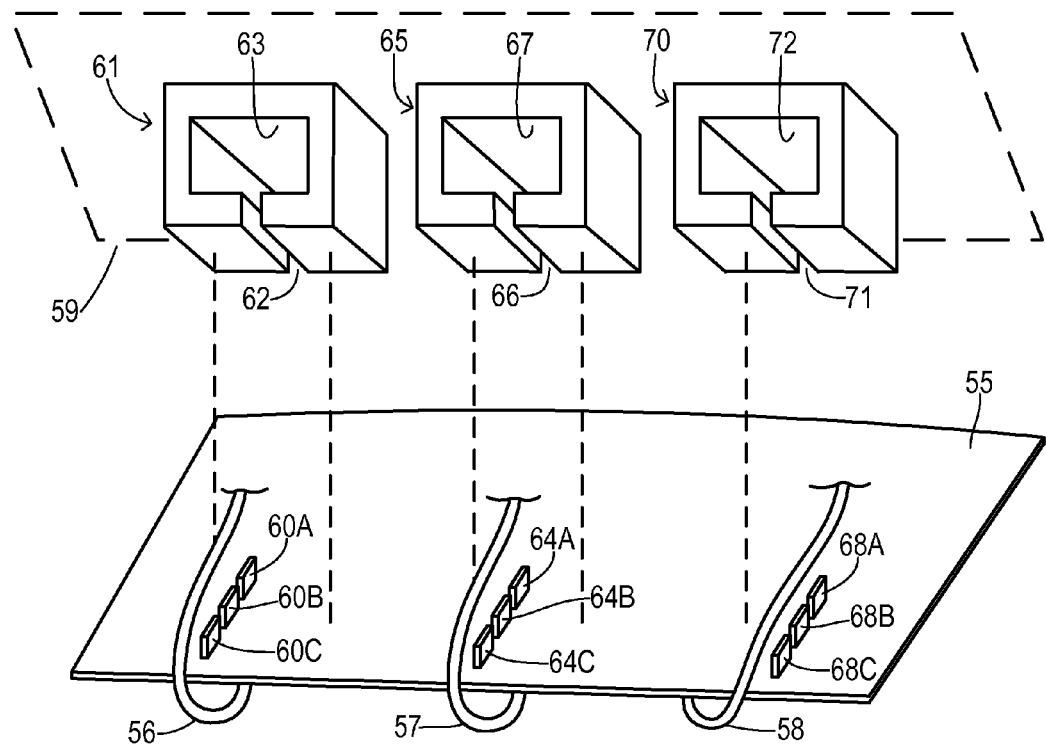
FIG. 5 shows a plurality of phase conductors with each phase having a flux core receiving a respective plurality of Hall-effect sensors.

FIG. 5 shows a further embodiment of the invention wherein current measurement is performed for three phases of an electric machine. Thus, a printed circuit board 55 has phase conductors 56, 57, and 58 terminated thereon, for delivering respective phase currents to the electric machine (not shown). Redundant Hall-effect devices 60A, 60B, and 60C are mounted in a row on one side of board 55 so that when board 55 is installed with a core 61 (e.g., with core 61 having been previously mounted in a housing 59), then devices 60A-60C are placed within a gap 62 of core 61 and conductor 56 is placed in a central passage 63 of core 61. Likewise, redundant Hall-effect devices 64A, 64B, and 64C are mounted (either through-hole or surface mounted) in another row on one side of board 55 in order to be received in a gap 66 of a core 65 likewise mounted in housing 59. Additionally, conductor 57 is received in a central passage 67 of core 65. Redundant Hall-effect devices 68A, 68B, and 68C are mounted in a row on one side of board 55 in order to be received in a gap 71 of a core 70. Additionally, conductor 58 is received in a central passage 72 of core 70. Thus, the Hall sensors can be efficiently arranged in a compact and convenient manner on one side of a printed circuit board, and the flux cores are conveniently placed to interact with the Hall sensors and load conductors in a manner that maintains a substantially equal flux coupling to each sensor, so that accurate current measurements are made with a high reliability since multiple component failures would have to conspire in order to prevent an accurate current measurement from being taken and communicated.

Figure 6:
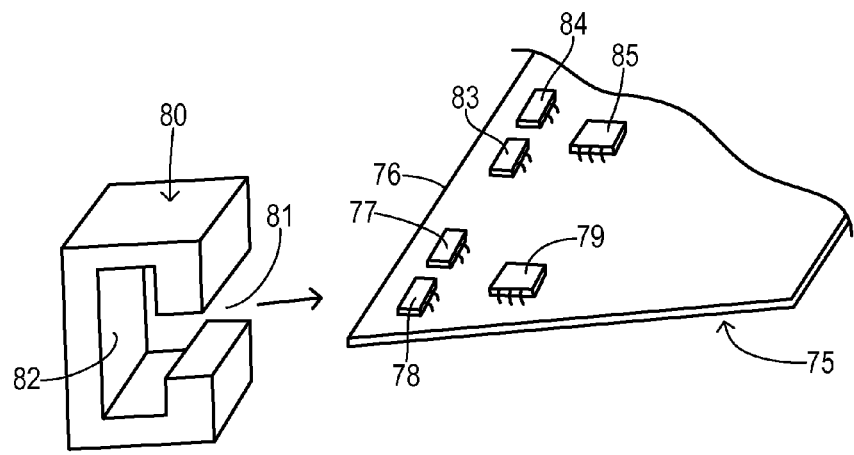
FIG. 6 is a perspective view showing an alternate arrangement for placing surface mount Hall-effect sensors within a shared flux core.

FIG. 6 shows another arrangement wherein a printed circuit board 75 has a side edge 76 wherein a redundant pair of Hall sensor ICs 77 and 78 are mounted. A flux core 80 has a gap 81 for receiving edge 76 of board 75 so that Hall sensor ICs 77 and 78 may be disposed within gap 81. A corresponding phase conductor (not shown) would be received in central passage 82 of core 80. An operational amplifier (op amp) integrated circuit 79 is shown on a circuit board 75 for conditioning the Hall-effect current signals. Hall sensor ICs 83 and 84 are also mounted along edge 76 in order to receive another flux core (not shown). An op amp 85 is mounted on board 75 for conditioning additional sensor signals. Although one op amp device is shown per motor phase in FIG. 6, the respective Hall sensor signals from each phase may preferably be interleaved among the different op amp devices for increased reliability as discussed below. Similarly, Hall effect ICs for a third phase and a third op amp can be placed on board 75, with a third flux core being arranged to receive them.

Figure 7:
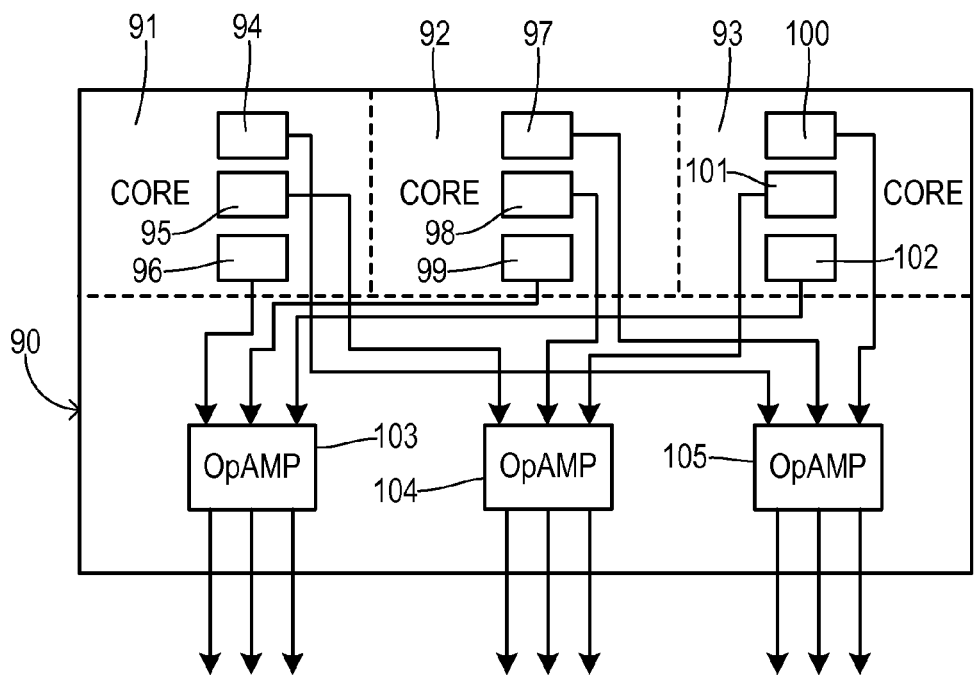
FIG. 7 is a block diagram showing a current measuring circuit with triple redundancy of both the Hall-effect sensors and the amplifiers to measure and report current measurement signals to a controller.

FIG. 7 shows a printed circuit board 90 as part of an electric drive for a three-phase electric machine. Flux cores 91, 92, and 93 receive flux from respective phase conductors (not shown), and each core accommodates three respective Hall elements. Thus, core 91 receives Hall elements 94-96, core 92 receives Hall elements 97-99, and core 93 receives Hall elements 100-102. Op amp devices 103, 104, and 105 mounted on a circuit board 90 may each be comprised of a multi-channel device (e.g., a quad op amp device), with each op amp receiving one measured current signal from each one of the phase conductors at a respective channel. Thus, op amp 103 has a first channel receiving a measured current signal from Hall device 96, a second channel receiving a measured current signal from Hall device 99, and a third channel receiving a measured current signal from Hall device 102. It is well known that a typical failure mode for an integrated circuit device results in complete loss of functionality for the integrated circuit device. However, the failure of one device may typically have no impact on other nearby devices. Using the circuit topology shown in FIG. 7, the failure of at least three different devices is required in order to prevent a valid condition current signal from being received by the inverter controller. For example, if any single op amp fails, there is no impact on current sensing. Even if two op amps out of three fails, then full system control can still be maintained and there is no impact on functionality (unless one or more Hall devices fail simultaneously).

Figure 8:
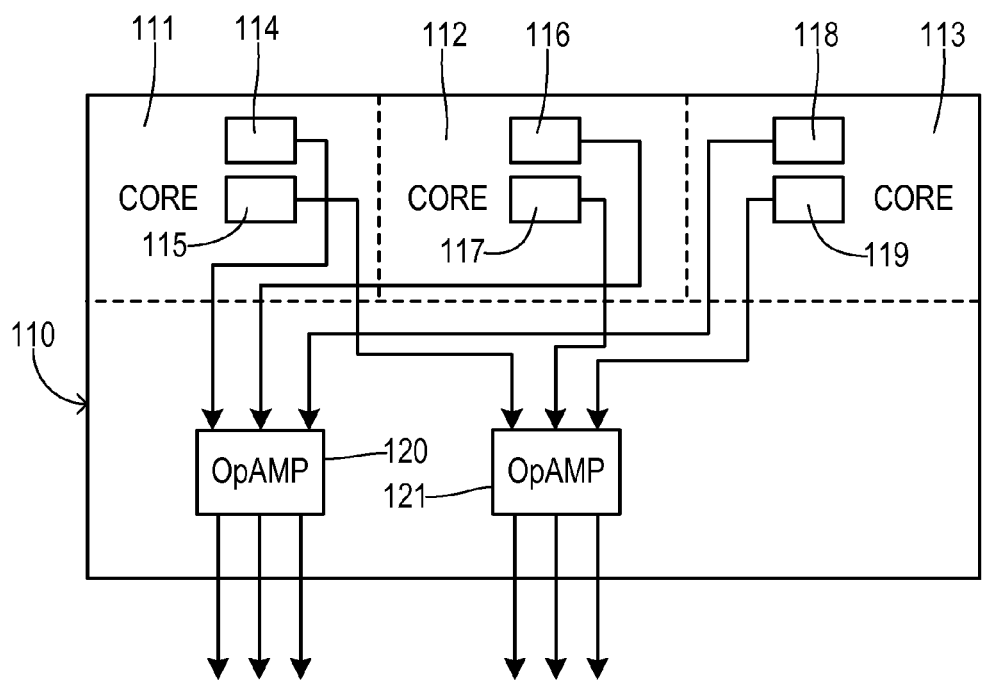
FIG. 8 is a block diagram showing a current measuring circuit with double redundancy of both the Hall-effect sensors and the amplifiers to measure and report current measurement signals to a controller.

FIG. 8 shows an alternative embodiment with double redundancy (i.e., there are two independent Hall devices per phase and two op amp devices) to ensure reliable sensor performance. Thus, printed circuit board 110 is disposed against flux cores 111, 112, and 113 to receive respective phase conductors and to receive respective Hall sensor ICs 114-119 as shown. Op amp devices 120 and 121 are interleaved to receive in each respective op amp channel a current signal from a different one of the phase conductors. Thus, a valid conditioned current signal corresponding to each phase conductor is received by the inverter controller unless either i) both Hall-effect devices for one phase fail, or ii) both op amps 120 and 121 fail simultaneously.

Stated more generally, the invention as shown in FIGS. 7 and 8 uses a predetermined number of Hall-effect devices for each phase conductor. The same predetermined number of operational amplifiers are utilized wherein each op amp device has a number of channels greater than or equal to the predetermined number. Each one of the plurality of Hall-effect devices for each phase is connected to a different one of the op amp devices. Unless there are multiple failures of the Hall-effect devices and the op amp devices, a valid conditioned current signal continues to be received by the inverter controller for each phase conductor.

Figure 9:
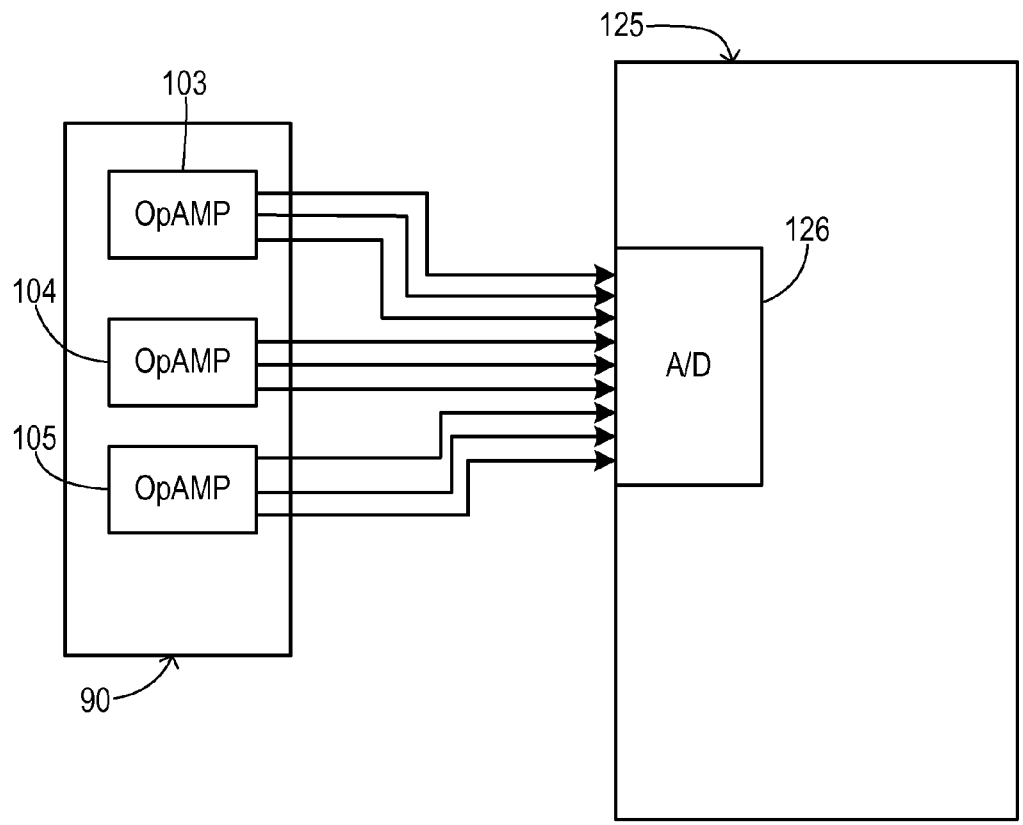
FIGS. 9 and 10 are block diagrams showing the analog-to-digital conversion of the amplified signals without redundancy and with redundancy, respectively.
Figure 10:
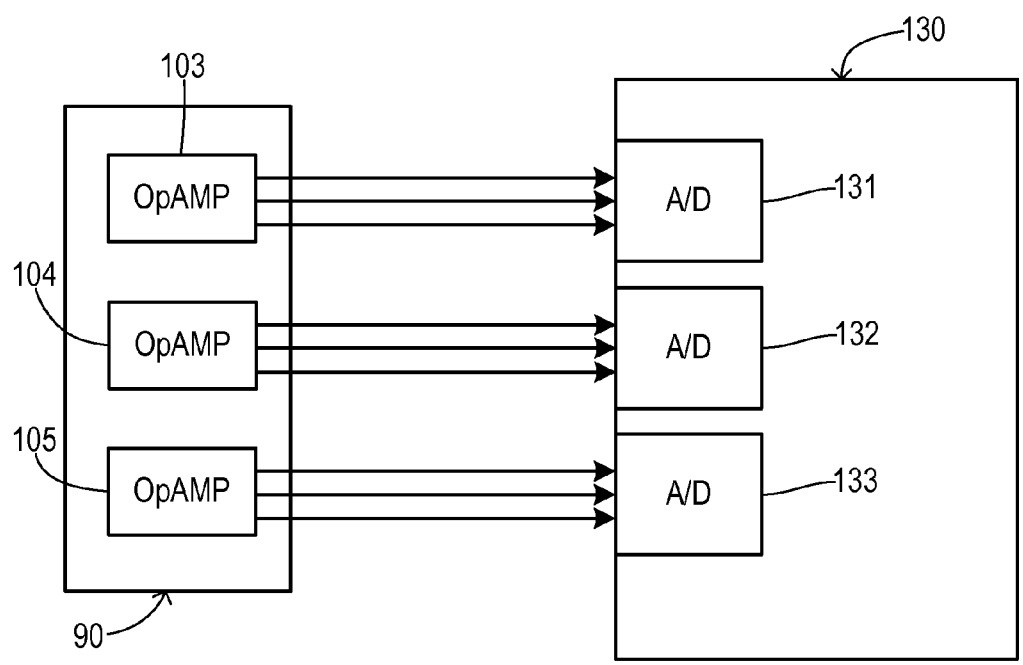

FIG. 9 shows interconnection of op amps 103-105 on circuit board 90 to an inverter controller 125 which includes an analog-to-digital converter 126. Converter 126 may be comprised of a single channel for sequentially sampling each of the current sensor signals from op amps 103-105. The three signals for each phase may be compared by a software algorithm in controller 125 to identify any faulty signals. For example, if one particular signal significantly deviates from the other two signals or fails to appropriately vary at the rotational speed of the electric machine, then a decision may be made that a particular sensor signal is faulty (provided the error is persistent over a number of consecutive samples). FIG. 10 shows an embodiment which builds-in additional redundancy using an inverter controller 130 with three separate analog-to-digital converter channels 131-133. Each op amp 103-105 is fed to a different converter channel or device, resulting in current measurements for each phase being distributed between different ones of the converters 131-133. The converted current measurements are then analyzed using the same fault detection algorithms to identify any faulty measurements. In addition, the valid measurements for each phase could be combined or a particular one of the valid signals could be selected for use in the PWM control of the electric machine.

What is claimed is:

1. An electric drive for an electric vehicle with a multi-phase electric machine, comprising:
   an inverter bridge having inverter switches arranged in a plurality of phase legs;
   an inverter controller for controllably switching the inverter switches;
   first and second phase conductors coupled between respective inverter phase legs and respective phase windings of the electric machine;
   first and second flux cores each having a central passage and a gap, respectively, wherein the first and second phase conductors pass through the central passages of the first and second flux cores, respectively;
   a first plurality of current sensors comprised of a predetermined number of first Hall-effect devices, each of the first Hall-effect devices disposed in the gap of the first flux core to generate respective first current signals;
   a second plurality of current sensors comprised of the predetermined number of second Hall-effect devices, each of the second Hall-effect devices disposed in the gap of the second flux core to generate respective second current signals; and
   a plurality of multi-channel op amp devices for conditioning the current signals and coupling them to an inverter controller, wherein the number of multi-channel op amp devices equals the predetermined number;
   wherein each one of the first Hall-effect devices is connected to a different one of the op amp devices, and wherein each one of the second Hall-effect devices is connected to a different one of the op amp devices, whereby a valid conditioned current signal corresponding to each phase conductor is received by the inverter controller unless there are multiple failures of the Hall-effect devices and the op amp devices.

2. The electric drive of claim 1 wherein the electric machine has three phases, and wherein the electric drive further comprises:
   a third phase conductor coupled between a respective inverter phase leg and a respective phase winding of the electric machine;
   a third flux core having a central passage and a gap, wherein the third phase conductor passes through the central passage of the third flux core; and
   a third plurality of current sensors comprised of three Hall-effect devices, each of the third Hall-effect devices disposed in the gap of the third flux core to generate respective third current signals;

wherein the predetermined number is three, and wherein each one of the third Hall-effect devices is connected to a different one of the three op amp devices.

3. The electric drive of claim 1 wherein the inverter controller includes the predetermined number of analog-to-digital converters, and wherein each op amp device is connected to a different one of the analog-to-digital converters.

4. The electric drive of claim 1 wherein the inverter controller compares the conditioned current signals corresponding to each phase conductor in order to detect a faulty conditioned current signal.

5. The electric drive of claim 1 wherein each plurality of Hall-effect devices are mounted on a circuit board in a respective row, and wherein a respective flux core and the circuit board are installed in a housing so that the respective gap receives the respective row of Hall-effect devices.

6. A method of measuring phase currents of an inverter-driven electric machine, comprising:
   mounting phase conductors of each respective phase current into a central passage of a respective flux core;
   mounting a respective plurality of current sensors into a gap of each respective flux core to generate a respective plurality of current signals for each phase current, wherein each plurality of current sensors is comprised of a predetermined number of Hall-effect devices; and
   connecting the Hall-effect devices to a plurality of multi-channel op amp devices for conditioning the current signals such that each one of a respective plurality of Hall-effect devices is connected to a different one of the op amp devices and such that each op amp device receives one current signal corresponding to each phase current;
   whereby a valid conditioned current signal corresponding to each phase conductor is generated by the op amp devices unless there are multiple simultaneous failures of the Hall-effect devices and the op amp devices.

7. The method of claim 6 wherein an inverter controller controls an inverter bridge to supply the phase currents to the electric machine, the method further comprising:
   converting to digital representation the conditioned current signals using a plurality of analog-to-digital converters, wherein each op amp device is connected to a different one of the analog-to-digital converters.

8. The method of claim 7 further comprising:
   the inverter controller comparing the conditioned current signals corresponding to each phase conductor in order to detect a faulty conditioned current signal.

* * * * *